US009773635B2

(12) United States Patent
Lissotschenko

(10) Patent No.: US 9,773,635 B2
(45) Date of Patent: Sep. 26, 2017

(54) DEVICE FOR PRODUCING AN ELECTRON BEAM

(71) Applicant: LIMO Patentverwaltung GmbH & Co. KG, Dortmund (DE)

(72) Inventor: Vitalij Lissotschenko, Froendenberg (DE)

(73) Assignee: LILAS GMBH, Dortmund (DE)

( * ) Notice: Subject to any disclaimer, the term of this patent is extended or adjusted under 35 U.S.C. 154(b) by 25 days.

(21) Appl. No.: 14/412,754

(22) PCT Filed: Mar. 12, 2013

(86) PCT No.: PCT/EP2013/055039
§ 371 (c)(1),
(2) Date: Jan. 5, 2015

(87) PCT Pub. No.: WO2014/009028
PCT Pub. Date: Jan. 16, 2014

(65) Prior Publication Data
US 2015/0144800 A1    May 28, 2015

(30) Foreign Application Priority Data

Jul. 7, 2012 (DE) .................. 10 2012 013 593
Sep. 20, 2012 (DE) .................. 10 2012 108 888
Nov. 6, 2012 (DE) .................. 10 2012 110 627

(51) Int. Cl.
H01J 29/70 (2006.01)
H01J 37/06 (2006.01)
(Continued)

(52) U.S. Cl.
CPC ............... *H01J 29/70* (2013.01); *H01J 3/30* (2013.01); *H01J 29/04* (2013.01); *H01J 29/48* (2013.01);
(Continued)

(58) Field of Classification Search
CPC combination set(s) only.
See application file for complete search history.

(56) References Cited

U.S. PATENT DOCUMENTS 3,080,500 A * 3/1963 Preston .................. H01J 29/52
313/423
5,319,207 A    6/1994 Rose et al.
(Continued)

FOREIGN PATENT DOCUMENTS

CH    196450 A    3/1938
CN    102446693 A    5/2012
(Continued)

OTHER PUBLICATIONS

Read, F.: "The parallel cylindrical mirror electron energy analyzer". Rev. Sci. Instrum. 73 (2002), pp. 1129-1139.
(Continued)

*Primary Examiner* — Phillip A Johnston
*Assistant Examiner* — Hsien Tsai
(74) *Attorney, Agent, or Firm* — Cohen & Hildebrand, PLLC

(57) ABSTRACT

The invention relates to a device (20) for producing an electron beam (4), which comprises a hot cathode (1), a cathode electrode (2), an anode electrode (3) having an opening (6) through which an electron beam (4) produced by the device can pass, wherein during the operation of the device (20) a voltage for accelerating the electrons exiting from the hot cathode (1) is applied between the cathode electrode (2) and the anode electrode (3), and further comprising deflection means that can deflect the electron beam (4) that has passed through the opening of the anode electrode (3), wherein the deflection means comprise at least one deflection electrode (8, 12), which can reflect the electron beam (4) and/or which comprises a deflection
(Continued)

surface (9) that is inclined towards the propagation direction of the electron beam (4).

28 Claims, 7 Drawing Sheets

(51) Int. Cl.
| H01J 37/147 | (2006.01) |
| H01J 37/15 | (2006.01) |
| H01J 37/305 | (2006.01) |
| H01J 3/30 | (2006.01) |
| H01J 29/04 | (2006.01) |
| H01J 29/48 | (2006.01) |
| H01J 31/00 | (2006.01) |

(52) U.S. Cl.
CPC .............. *H01J 31/00* (2013.01); *H01J 37/06* (2013.01); *H01J 37/147* (2013.01); *H01J 37/15* (2013.01); *H01J 37/305* (2013.01); *H01J 2237/0213* (2013.01); *H01J 2237/061* (2013.01); *H01J 2237/06308* (2013.01)

(56) References Cited

U.S. PATENT DOCUMENTS

| 5,376,788 | A | 12/1994 | Standing et al. |
| 5,504,302 | A | 4/1996 | Hentze |
| 5,955,730 | A | 9/1999 | Kerley et al. |
| 5,955,829 | A | 9/1999 | Seyfert et al. |
| 6,541,776 | B1 | 4/2003 | Doring et al. |
| 7,989,759 | B2 | 8/2011 | Holle |
| 2001/0016237 | A1* | 8/2001 | Bahr ................ H01J 37/302 427/585 |
| 2001/0043779 | A1 | 11/2001 | Lissotschenko |
| 2003/0111948 | A1* | 6/2003 | Retsky ................ H01J 3/30 313/364 |
| 2009/0045355 | A1* | 2/2009 | Desbrandes ............ H01J 43/18 250/503.1 |
| 2009/0184262 | A1 | 7/2009 | Bartel et al. |
| 2010/0084549 | A1* | 4/2010 | Ermakov ............ H01J 49/4245 250/283 |
| 2011/0291021 | A1* | 12/2011 | Petric ................ B82Y 10/00 250/396 ML |
| 2012/0217042 | A1 | 8/2012 | Leffler et al. |

FOREIGN PATENT DOCUMENTS

| DE | 3442243 A1 | 5/1986 |
| DE | 268330 A1 | 5/1989 |
| DE | 4129403 A1 | 3/1993 |
| DE | 4234740 A1 | 4/1994 |
| DE | 19633496 A1 | 2/1998 |
| DE | 19638925 A1 | 4/1998 |
| DE | 19942142 A1 | 3/2001 |
| DE | 10157403 A1 | 6/2003 |
| DE | 102005045622 A1 | 4/2007 |
| DE | 102007048618 A1 | 4/2009 |
| DE | 102009051374 A1 | 6/2011 |
| DE | 102010010981 A1 | 9/2011 |
| EP | 0092873 A2 | 11/1983 |
| EP | 0408288 A1 | 1/1991 |
| EP | 2426692 A2 | 3/2012 |
| EP | 2426693 A2 | 3/2012 |
| GB | 1567151 A | 5/1980 |
| GB | 2153700 A | 8/1985 |
| JP | 2000325441 A | 11/2000 |
| WO | WO 0243803 A1 * | 6/2002 ............ H01J 27/205 |

OTHER PUBLICATIONS

Gerlach, R.: "Retarding-Field-Cylindrical-Mirror Analyzer", J. Vac. Sci. Technol.10, (1973). pp. 122-125.

International Search Report PCT/EP2013/055039 dated Jul. 5, 2013.

German Patent Office Search Report for 10 2012 013 593.9 dated Jan. 23, 2013.

* cited by examiner

DEVICE FOR PRODUCING AN ELECTRON BEAM

This is an application filed under 35 USC §371 of PCT/EP2013/055039 filed on Mar. 12, 2013, claiming priority to DE 10 2012 013 593.9 filed on Jul. 7, 2012 and to DE 10 2012 108 888.8 filed on Sep. 20, 2012 and to DE 10 2012 110 627.4 filed on Nov. 6, 2012.

BACKGROUND OF THE INVENTION

The present invention relates to a device for producing an electron beam according to the preamble of claim 1 and an arrangement of two such devices.

Such devices are well known and can for example be designed as a Pierce-type electron gun. Two electrodes disposed in opposition in the transverse direction of the beam generally serve as a deflection means, which can effect an electrostatic deflection of the electron beam. However, the maximum achievable deflection angles for such an electrostatic deflection are disadvantageously only in the range of about 7°. Larger deflection angles would be desirable because the structure of a corresponding device can be reduced in size.

Furthermore, it would be desirable to be able to form the beam profile of the electron beam with simple means.

BRIEF SUMMARY OF THE INVENTION

The problem underlying the present invention is to provide a device of the aforementioned type, which permits greater deflection angles, and/or with which the beam profile of the electron beam can be formed by simple means and/or which has low maintenance requirements and/or with which a longer or more intense line can be produced.

According to claim 1, the deflection means include a deflection electrode at which the electron beam can be reflected and/or which has a deflection surface that is inclined with respect to the propagation direction of the electron beam. Very large deflection angles, for example between 0° and 180°, are possible due to the reflection at the deflection electrode, which corresponds to a reflection at a mirror.

The normal on the deflection surface of the deflection electrode may enclose an angle between 0° and 90°, preferably an angle between 20° and 70°, in particular an angle between 30° and 60°, for example an angle of 45°, with the connecting line between the hot cathode and the opening in the anode electrode. A deflection angle of 90° would result in an angle of 45°.

Preferably, the deflection electrode is at the same potential as the cathode electrode, and is in particular connected to the same voltage source as the cathode electrode. With the connection to the same voltage source, it can be ensured that the electrons are essentially fully decelerated by the deflection electrode.

Furthermore, the device may include another electrode which has a positive potential relative to the deflection electrode and can accelerate the electrons following the interaction with the deflection electrode. The decelerated electrodes can thus be accelerated toward the additional electrode. This additional electrode should therefore be positioned so that the acceleration takes place at the desired angle of deflection.

The deflection means comprise two mutually opposing electrodes, between which an AC voltage is applied which can deflect the electron beam so that the beam profile of the electron beam can be specifically designed. The AC voltage may have a frequency greater than 10 kHz, preferably between 25 kHz and 75 kHz, in particular between 40 kHz and 60 kHz, for example a frequency of 50 kHz.

The two mutually opposing electrodes can, due to the comparatively high frequency of AC voltage, move the electron beam back and forth on a workpiece to be processed at high speed. In particular, the AC voltage may be selectively influenced to that some areas of the surface of the workpiece are exposed for a longer time to the electron beam than other areas. In particular, when changes caused by the thermal energy transferred by the electron beam are to be effected on the workpiece by the electron beam, the effective beam profile of the electron beam on the workpiece corresponds to an averaged intensity distribution of the electron beam moving back and forth on the workpiece at high speed. This occurs in particular because thermal processes are usually slower than the motion of the electron beam on the workpiece. This offers the possibility to select or intentionally shape an effective beam profile of the electron beam by way of the two electrodes and the AC control voltage.

The device may include heating means configured to heat the at least one deflection electrode. This proves to be particularly useful when workpieces are processed with the electron beam so as to cause the workpieces to partially melt and emit particulate vapors. These particulate vapors can deposit on the deflection electrodes, in particular on the output-side deflection electrode of the device. The at least one deflection electrode, in particular the output-side deflection electrode is heated with the heating device so that the particles from the workpiece deposited on the deflection electrode are quickly evaporated again or removed from the deflection electrode.

The heating means may here include, for example, a current source adapted to cause a current flow through the at least one deflection electrode for heating. Alternatively, however, other heating means may be provided, such as a radiant heating element arranged adjacent to the at least one deflection electrode.

The device may include cover means, which are arranged so as to prevent particulate vapors from the workpiece to be processed from reaching the region of the hot cathode, the cathode electrode, the anode electrode or the deflection electrode.

The device may be designed to produce an electron beam with a line-shaped cross-section subdivided into mutually spaced-apart stripes. This proves to be particularly advantageous when an arrangement according to claim 19 is created from two such devices, wherein the devices are designed and arranged such that the stripes of the first device are offset with respect to the stripes of the second device so as to produce in the work area a continuous line, in which one stripe of the first device alternates with a stripe of the second device. In this way, longer or more intense lines can be produced.

BRIEF DESCRIPTION OF THE DRAWINGS

Additional features and advantages of the present invention will become apparent from the following description of preferred exemplary embodiments with reference to the accompanying drawings, which show in.

DETAILED DESCRIPTION OF THE INVENTION

Figure 4:
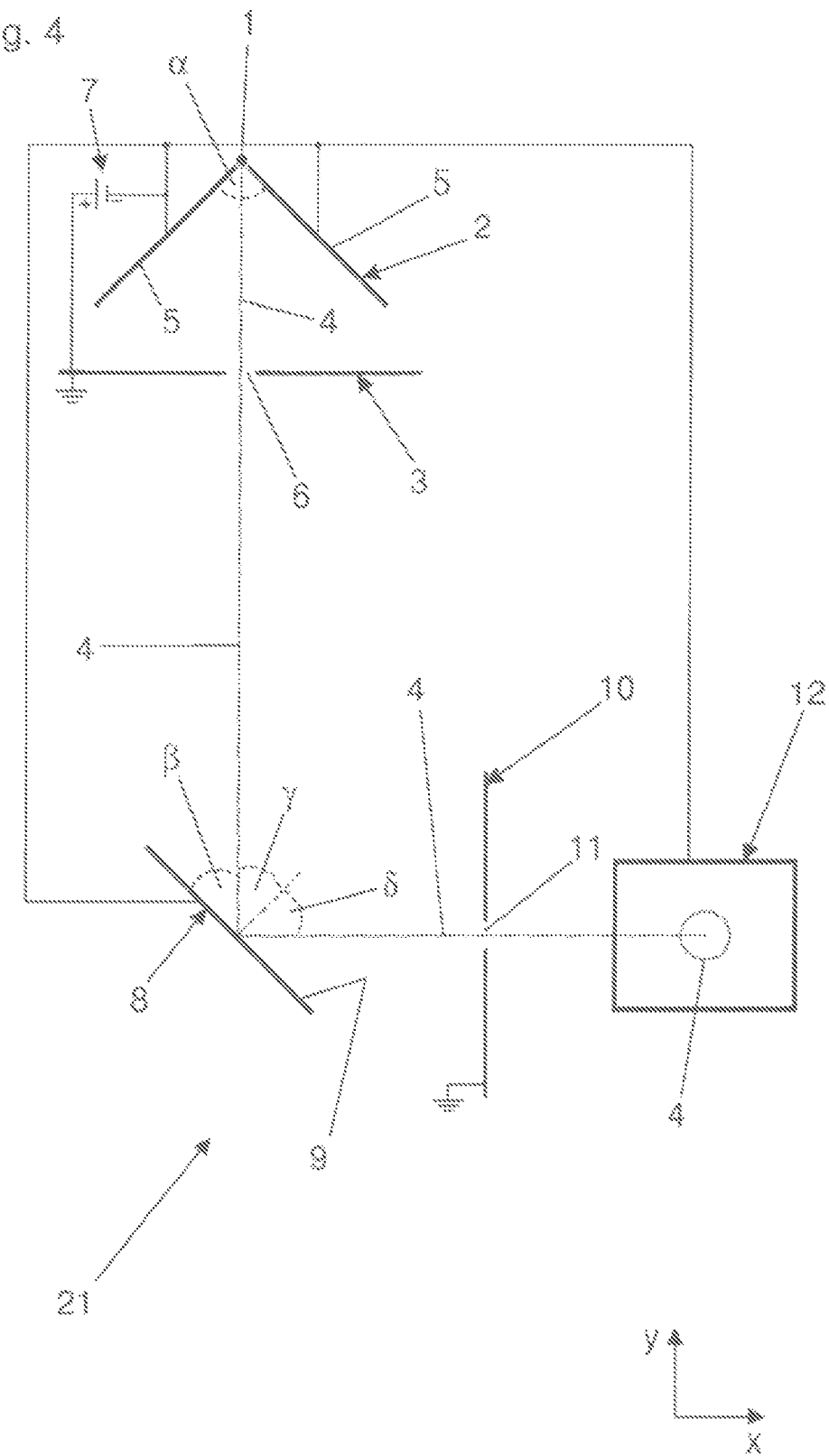
FIG. 4 a schematic partial plan view of a second exemplary embodiment of a device according to the invention.
Figure 5:
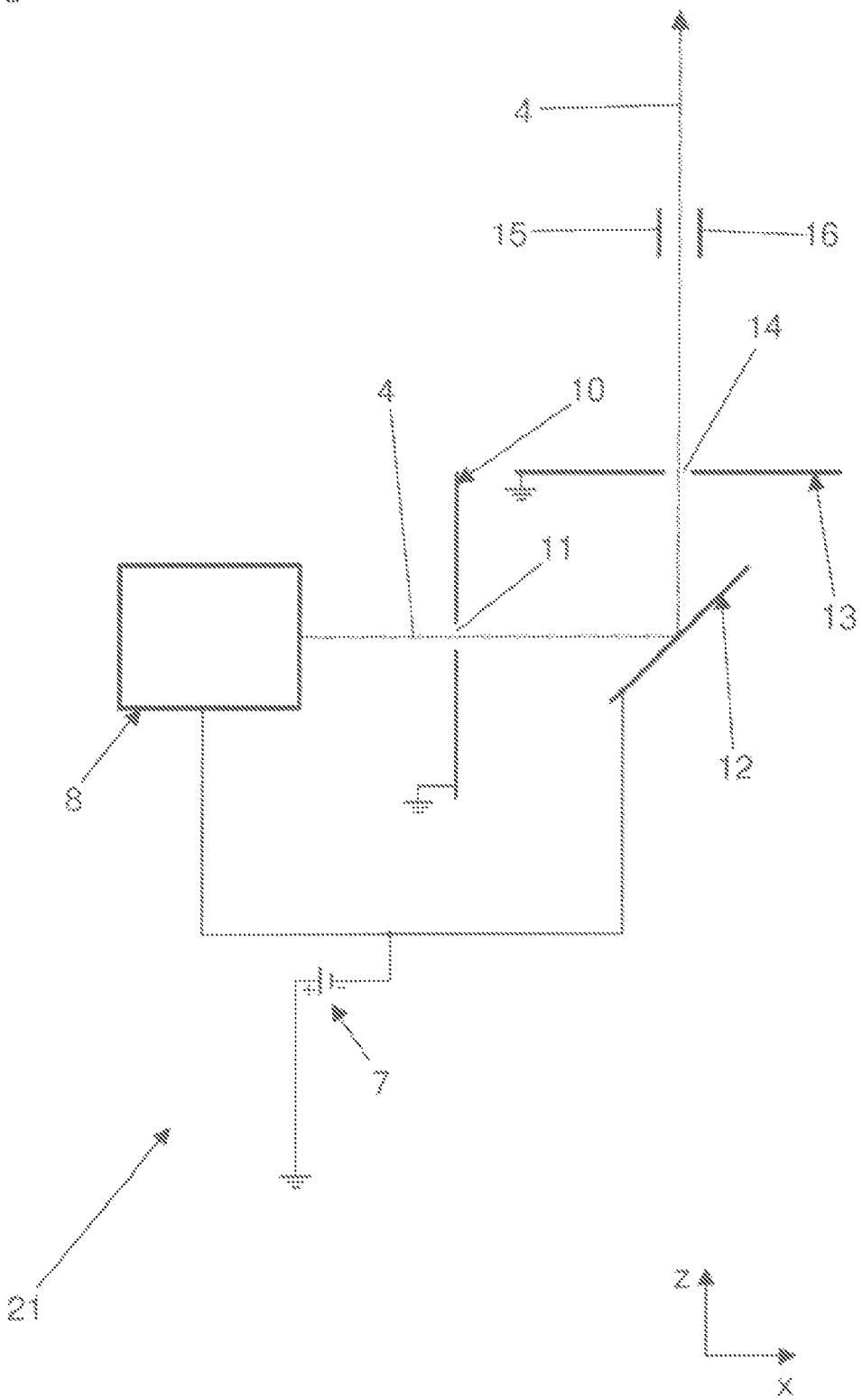
FIG. 5 a partial side view of the exemplary embodiment of FIG. 4.

Identical or functionally similar components or elements are indicated in the figures with the same reference symbols. FIGS. 4 and 5 each show a Cartesian coordinate system.

In the described device, several or in particular all of the parts may be arranged in a vacuum. The required housing is not or not fully illustrated in the figures.

Figure 1:
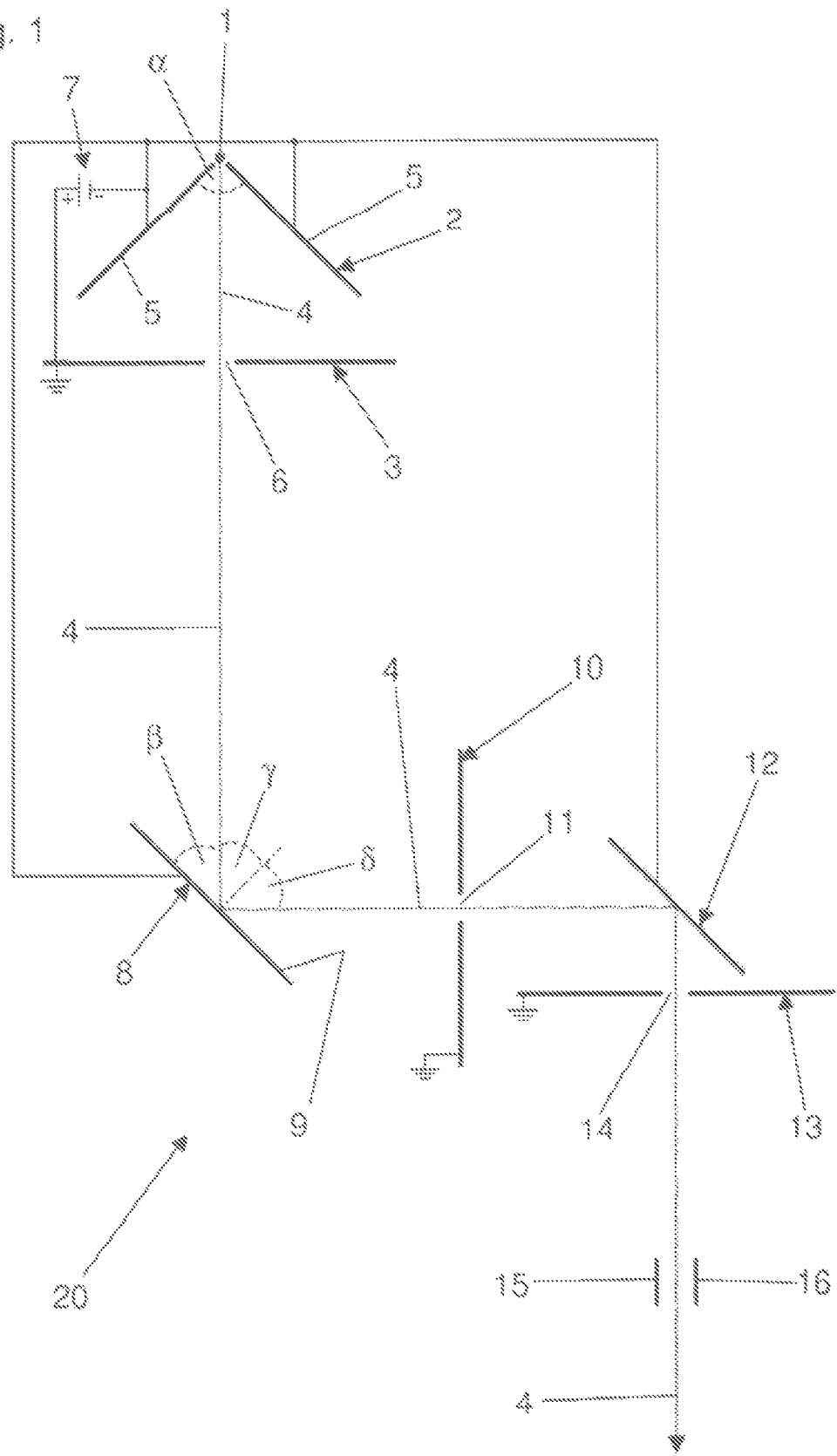
FIG. 1 a schematic diagram of a first exemplary embodiment of a device according to the invention.

The device 20 shown in FIG. 1 includes a hot cathode 1, a cathode electrode 2 and an anode electrode 3. With regard to these parts, the device 20 corresponds essentially to an electron gun of the Pierce-type, which can produce an electron beam 4.

The hot cathode 1 is constructed as a wire and extends into the drawing plane of FIG. 1 or in a longitudinal direction perpendicular to the propagation direction of the electron beam 4. This configuration produces an electron beam 4 with a line-shaped cross-section, wherein the longitudinal direction of the line-shaped cross-section is aligned parallel to the longitudinal direction of the wire forming the hot cathode 1.

A voltage from unillustrated voltage means is applied to the hot cathode 1, producing a current flow through the hot cathode 1, which causes the hot cathode 1 to heat up. The hot cathode 1 may at least partially be at the same potential as the cathode electrode 2.

The cathode electrode includes parts 5 that extend away from the hot cathode 1 and enclose with one another an angle α between 70 and 110°, for example, an angle α of about 90°. The two parts 5 extend into the drawing plane of FIG. 1, in particular without a change in their cross-section.

However, the cathode electrode 2 or the parts 5 of the cathode electrode 2 may have in the longitudinal direction of the wire forming the hot cathode 1 a pattern capable of causing a modulation of the electron beam 4 in the longitudinal direction of the line-shaped cross-section.

The anode electrode 3 has an opening 6, through which the electron beam 4 emitted by the hot cathode 1 can pass. The opening 6 is in particular rectangular and may have a much larger dimension in its longitudinal direction which extends into the drawing plane of FIG. 1, than in its transverse direction so as to let the line-shaped electron beam pass through.

During the operation of the device 20, a voltage produced by a voltage source 7 schematically indicated in FIG. 1 is applied between the cathode electrode 2 and anode electrode 3 for accelerating the electrons emitted from the hot cathode 1. The voltage may be, for example, between 1 kV and 10 kV. The cathode electrode 2 is here connected to the negative pole and the anode electrode 3 to the positive pole of the voltage source 7, wherein in particular the anode electrode 3 is additionally connected to ground.

The device 20 furthermore includes a deflection electrode 8 serving as a deflection means, which is arranged in the beam path of the electron beam 4 after the anode electrode 3. The side of the deflection electrode 8 facing the electron beam 4 serves as a deflection surface 9. This deflection surface 9 encloses with the propagation direction of the electron beam 4 an angle β, which is in the illustrated embodiment approximately equal to 45°. The angle of incidence between the normal and the electron beam 45° is then γ.

The deflection electrode 8 is also at a negative potential, in particular at the same negative potential as the cathode electrode 2. Preferably, the deflection electrode 8 is connected to the negative pole of the same voltage source 7 as the cathode electrode 2. In this way, the electrons of the electron beam come to a stop at the deflection electrode 8.

The device 20 furthermore includes in the propagation direction of the electron beam 4 after the deflection electrode 8 an additional electrode 10 with an opening 11 for the passage of the electron beam 4 that corresponds to the opening 6. The additional electrode 10 is connected to ground and thus has a positive potential with respect to the deflection electrode 8. Therefore, the electrons of the electron beam 4 decelerated by the deflection electrode are accelerated by the additional electrode 10 in the direction of the additional electrode 10 and pass through the opening 11.

Due to the orientation of the deflection surface 9 of the deflection electrode 8 at an angle of 45°, the additional electrode 10 is also oriented at an angle of 45° with respect to the deflection electrode 8. Overall, the additional electrode 10 is oriented perpendicular to the anode electrode 3. The electron beam 4 is thus deflected at the deflection surface 9 by an angle of 90°. In particular, the deflection electrode 8 operates in conjunction with the additional electrode 10 as a mirror for the electron beam 4, so that like for a reflection at a mirror, the incident angle γ is equal to the exit angle δ.

The deflection surface 9 of the deflection electrode 8 may be oriented with respect to the electron beam 4 at other angles different from the depicted angle of 45°. The additional electrode 10 must then be oriented and positioned differently, so that the incident angle γ corresponds to the exit angle δ.

The deflection electrode 8 may also be designed to be pivoted, so that a different deflection direction can be selected during the operation. For example, stepper motors or piezo elements may be used for this purpose. The additional electrode 10 would then have to be pivoted and displaced commensurate with the pivoting of the deflection electrode 8.

The deflection surface 9 of the deflection electrode 8 may also be curved, in particular with a concave curvature, for focusing the electron beam 4.

In FIG. 1, an additional deflection electrode 12 is arranged by way of example after the additional electrode 10, after which an additional further electrode 13 with an opening 14 is provided. The electron beam 4 is once more deflected by the additional deflection electrode 12 and the additional further electrode 13 by 90°. However, the additional deflection electrode 12 and the additional further electrode 13 may also be omitted. On the other hand, more than two deflection units composed of a deflection electrode and an additional electrode may be provided.

When the cathode electrode 2 and the parts 5 of the cathode electrode 2 have a pattern in the longitudinal direction of the wire forming the hot cathode 1 in order to effect a modulation of the electron beam 4 in the longitudinal direction of the line-shaped cross-section, the anode electrode 3 and/or the deflection electrode 8, 12 and/or the additional electrode 10, 13 may also include a corresponding pattern in the longitudinal direction of the wire forming the hot cathode 1.

Optionally, two electrodes 15, 16 to which an AC voltage is applied and which act as a plate capacitor are provided after the two additional electrodes 12, 13. The corresponding voltage source is not shown. The AC voltage may have, for example, a frequency greater than 10 kHz, preferably between 25 kHz and 75 kHz, in particular between 40 kHz and 60 kHz, for example a frequency of 50 kHz. The two additional electrodes 12, 13 may also be omitted. They are then only used to shape the beam profile of the electron beam 4, as explained in more detail below. When shaping of a beam is not desired, the two additional electrodes 12, 13 may be omitted.

The two electrodes 15, 16 operating as a plate capacitor can, due to the comparatively high frequency of the AC voltage, move the electron beam 4 back and forth on a workpiece to be processed (not shown) at a high speed. In particular, the AC voltage can be selectively influenced in order to expose some areas of the surface of the workpiece to the electron beam 4 for a longer time than other areas.

Figure 2:
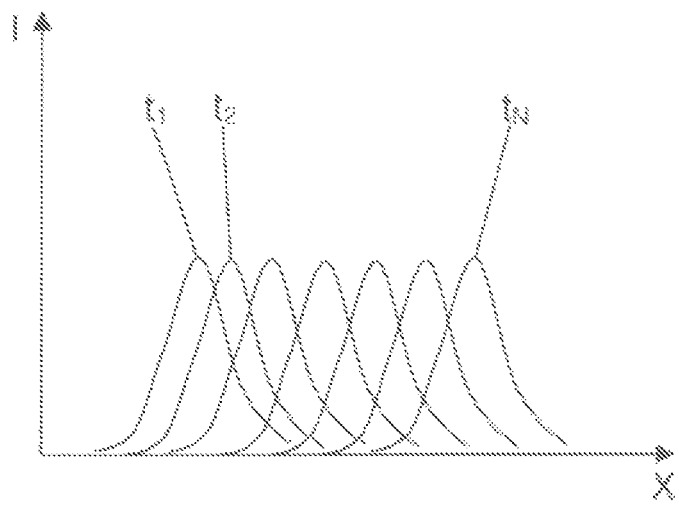
FIG. 2 a schematic diagram, wherein the intensity I is plotted as a function of a spatial coordinate X in a working plane of an electron beam at various time intervals $t_1$ to $t_N$.

FIG. 2 shows an example of a narrow electron beam that is moved on a workpiece along an X coordinate that corresponds, for example, to the direction perpendicular to the longitudinal extent of the cross section of the electron beam line. The intensity of the electron beam 4 is plotted in FIG. 2 in the vertical direction. In particular, time intervals $t_1$ to $t_N$ are assigned to the individual intensity distributions, during which the electron beam 4 is incident on the area with the corresponding spatial coordinate X.

Figure 3:
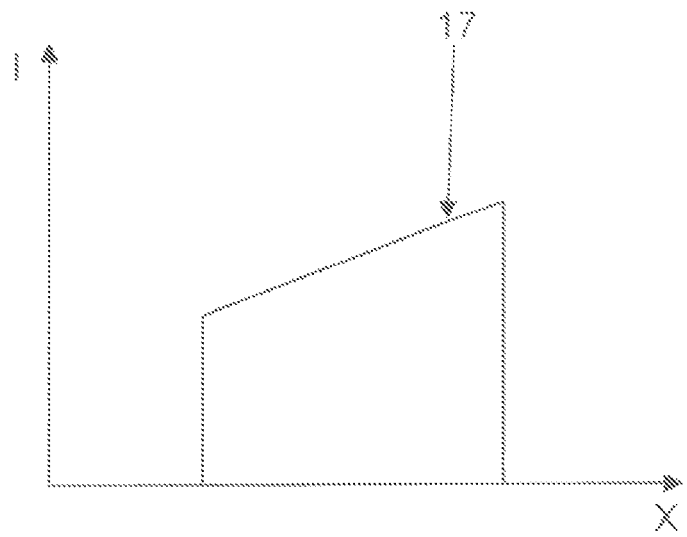
FIG. 3 a schematic diagram corresponding to FIG. 2, representing the time average of the intensity of the electron beam.

FIG. 3 shows a schematic diagram corresponding to FIG. 2, representing the time average of the intensity of the electron beam. In particular, when changes are to be effected on the workpiece by the electron beam 4, caused by the thermal energy transferred by the electron beam, the exemplary average intensity distribution 17 shown in FIG. 3 corresponds to the effective beam profile of the electron beam 4 on the workpiece. This is particularly due to the fact that thermal processes usually proceed more slowly than the motion of the electron beam 4 on the workpiece.

It is thus possible to specifically select or shape an effective beam profile of the electron beam 4 by way of the two electrodes 15, 16 operating as a plate capacitor and the AC control voltage. FIG. 3 shows only an arbitrarily selected example. Other beam profile shapes are possible.

When a very long electron beam line is to be produced, the wire functioning as a hot cathode 1 and/or the cathode electrode 2 and/or the anode electrode 3 and/or the deflection electrodes 8, 12 and/or the additional electrode 10, 13 can be divided into segments in the longitudinal direction of the wire forming the hot cathode 1. This allows a modular construction of the device.

The embodiments of a device 21 depicted in FIG. 4 and FIG. 5 differs from the first embodiment in that the second deflection electrode 12 is oriented so that the electron beam 4 is reflected out of the x-y-plane of the device and upwardly in the z-direction. The electron beam 4 is here merely schematically indicated by a circle, but shall in particular have a line-shaped cross-section. The line extends here before the reflection at the second deflection electrode 12 in the z-direction and after the reflection at the second deflection electrode 12 in the y-direction.

The only schematically indicated second deflection electrode 12 can have a greater extent in the x-direction than in the y-direction. Furthermore, the second deflection electrode 12 may be a curved electrode, in particular an electrode with a concave curvature. The only schematically illustrated first deflection electrode 8 may also have a greater extent in the z-direction than in the x-direction due to the linear cross-section of the electron beam 4. Furthermore, the first deflection 8 may be a curved electrode, in particular an electrode having a concave curvature.

The embodiment of a device 21 according to the invention depicted in FIG. 4 and FIG. 5 further includes heating means. For this purpose, the device 21 has an unillustrated current source, which is connected to the second deflection electrode 12 so as to cause a current flow through the second deflection electrode 12. This current should be sufficiently large to heat the second deflection electrode 12 to a sufficiently high temperature in order to evaporate possible deposits of particles of the workpiece to be processed.

Figure 6:
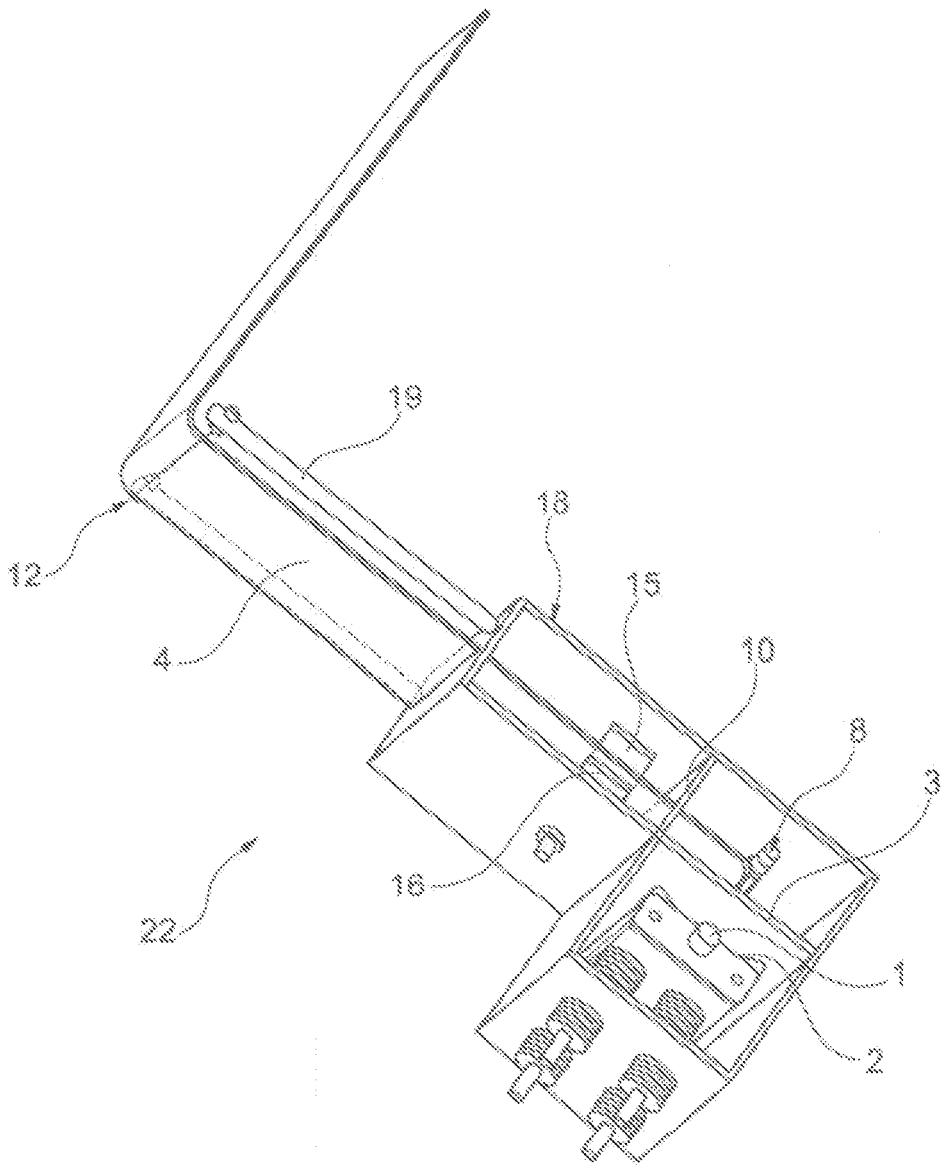
FIG. 6 a perspective view of a third exemplary embodiment of a device according to the invention.

The third embodiment of a device 22 according to the invention depicted in FIG. 6 is able to produce an electron beam 4 with a line-shaped cross-section. FIG. 6 shows part of a housing 18, from which plate-shaped cover means 19 extend to the second deflection electrode 12. These plate-shaped cover means 19 prevent particulate vapors from the workpiece to be processed from reaching the region of the hot cathode 1, the cathode electrode 2, the anode electrode 3, or the deflection electrode 8.

At the same time, like in the second embodiment, heating means may be provided for the second deflection electrode 12. In this third embodiment, too, the second deflection electrode 12 can be heated to a sufficiently high temperature to evaporate any deposits of particles of the workpiece to be processed.

Figure 7:
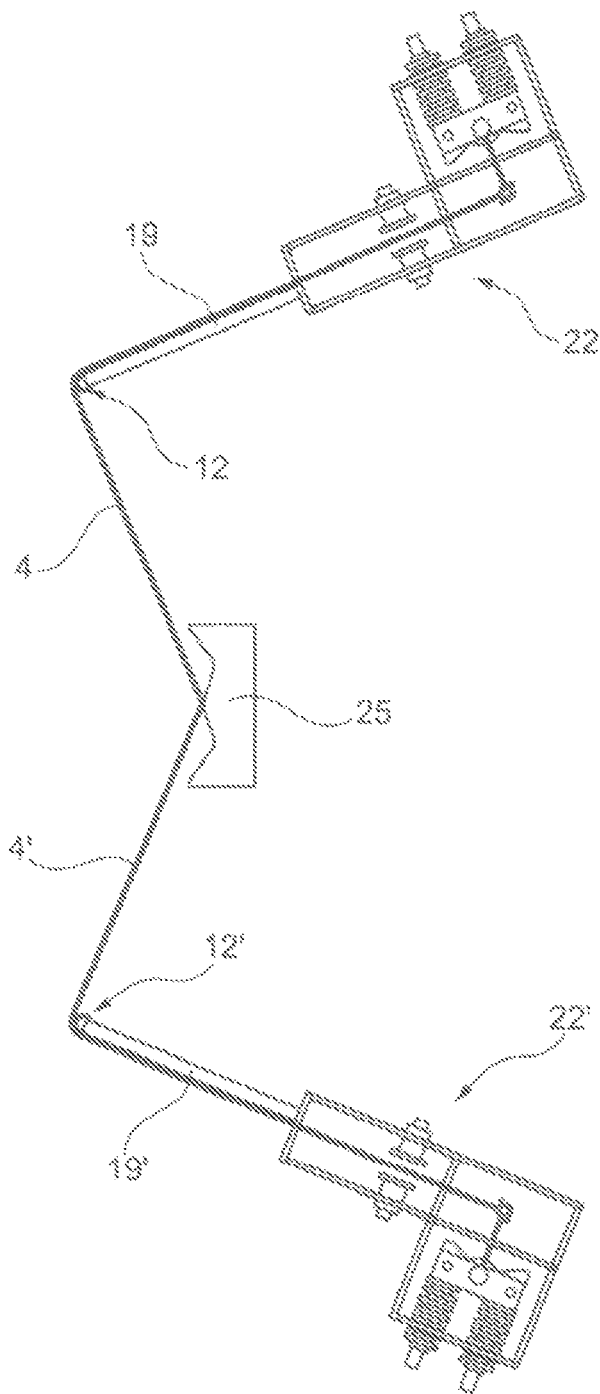
FIG. 7 a perspective view of a fourth exemplary embodiment of a device according to the invention.
Figure 8:
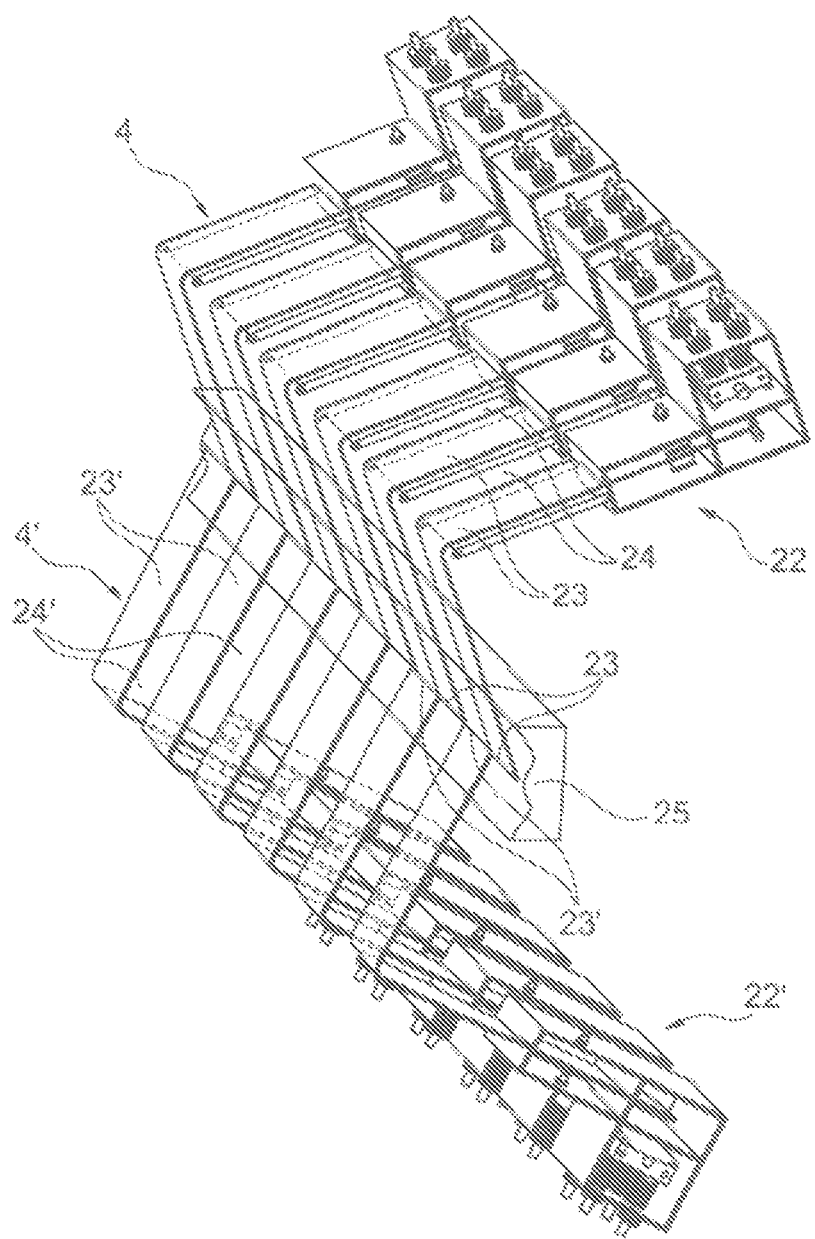
FIG. 8 a side view of the embodiment of FIG. 7.

The fourth embodiment of a device according to the invention depicted in FIG. 7 and FIG. 8 essentially corresponds to the arrangement of two devices 22, 22' according to FIG. 6. These devices 22, 22' are arranged so that their electron beams 4, 4' overlap on the workpiece 25 to be processed. This is shown in detail in FIG. 8, from which it can be inferred that both devices 22, 22' produce electron beams 4, 4' with line-shaped or strip-shaped cross-sections.

The devices 22, 22' are constructed such that spaced-apart stripes 23, 23' are arranged in the longitudinal direction of the line of the line-shaped cross section of each of the electron beams 4, 4'. The intermediate space 24, 24' between the stripes 23, 23' has in each case the same size as a stripe 23, 23'. Furthermore, the stripes 23 of the first device 22 are mutually offset relative to the stripes 23' of the second device 22' so as to produce on the workpiece 25 a continuous line, wherein a stripe 23 of the first device 22 alternates with a respective stripe 23' of the second device 22'.

The invention claimed is:
1. A device for producing an electron beam, comprising:
a hot cathode,
a cathode electrode,
an anode electrode with an opening through which an electron beam produced by the device is passable, wherein during operation of the device a voltage for accelerating electrons emitted from the hot cathode is applied between the cathode electrode and the anode electrode,
a deflector deflecting the electron beam that passed through opening of the anode electrode,
wherein the deflector comprises at least one deflection electrode at which the electron beam is reflected and having a deflection surface that is inclined relative to a propagation direction of the electron beam, wherein the hot cathode is constructed as a wire and extends in a longitudinal direction oriented perpendicular to the propagation direction of the electron beam, in order to obtain a line-shaped cross-section of the electron beam, and wherein the longitudinal direction of the line-shaped cross-section is oriented parallel to the longitudinal direction of the wire forming the hot cathode.

2. The device according to claim 1, wherein the deflection surface of the at least one deflection electrode encloses with a connection line between the hot cathode and the opening in the at least one anode electrode an angle of between 0° and 90°.

3. The device according to claim 1, wherein the at least one deflection electrode is at a same potential as the cathode electrode.

4. The device according to claim 1, wherein the device comprises at least one additional electrode which has a positive potential with respect to the at least one deflection electrode and which accelerates the electrons after interaction with the at least one deflection electrode.

5. The device according to claim 1, wherein the deflection surface of the at least one deflection electrode is curved.

6. The device according to claim 1, wherein at least one of: the wire serving as the hot cathode; the cathode electrode; the anode electrode; the at least one deflection electrode; and the at least one additional electrode is divided into segments in the longitudinal direction of the wire forming the hot cathode.

7. The device according to claim 1, wherein at least one of: the cathode electrode; the anode electrode; the at least one deflection electrode; and the at least one additional electrode extend in the longitudinal direction of the wire forming the hot cathode without a change in cross-section.

8. The device according to claim 1, wherein at least one of: the cathode electrode; the anode electrode; the at least one deflection electrode; and the at least one additional electrode have in the longitudinal direction of the wire forming the hot cathode at least one pattern modulating the electron beam in the longitudinal direction of the line-shaped cross-section.

9. The device according to claim 1, wherein the deflection surface of the at least one deflection electrode is movable.

10. The device according to claim 1, wherein the hot cathode, the cathode electrode and the anode electrode each corresponds in structure and/or control to a Pierce-type electron gun.

11. The device according to claim 1, wherein the deflector further comprises two mutually opposed electrodes, the electron beam passing between the two mutually opposed electrodes, between which an AC voltage is applied deflecting the electron beam so as to produce a beam profile of the electron beam.

12. The device according to claim 11, wherein the AC voltage has a frequency greater than 10 kHz.

13. The device according to claim 1, wherein the device comprises a heating device heating the at least one deflection electrode.

14. The device according to claim 13, wherein an output-side deflection electrode is heated by the heating device.

15. The device according to claim 13, wherein the heating device comprises a current source causing a current to flow through the at least one deflection electrode for heating.

16. The device according to claim 1, wherein the device comprises a cover arranged so as to prevent particulate vapors from a workpiece to be processed from reaching an area of the hot cathode, of the cathode electrode, of the anode electrode or of the deflection electrode.

17. The device according to claim 1, wherein the device is designed for producing the electron beam with a line-shaped cross-section that is subdivided into individual, mutually spaced-apart stripes.

18. An arrangement of two devices, each device comprising:
a hot cathode,
a cathode electrode,
an anode electrode with an opening through which an electron beam produced by the device passes, wherein during operation of the device a voltage for accelerating electrons emitted from the hot cathode is applied between the cathode electrode and the anode electrode,
a deflector deflecting the electron beam that passed through opening of the anode electrode,
wherein the deflector comprises at least one deflection electrode at which the electron beam is reflected and having a deflection surface that is inclined relative to a propagation direction of the electron beam, and
wherein the hot cathode is constructed as a wire and extends in a longitudinal direction oriented perpendicular to the propagation direction of the electron beam, in order to obtain a line-shaped cross-section of the electron beam, and wherein the longitudinal direction of the lire-shaped cross-section is oriented parallel to the longitudinal direction of the wire forming the hot cathode,
wherein both of the devices are designed for producing the electron beam with a line-shaped cross-section that is subdivided into individual, mutually spaced-apart stripes, and
wherein the devices are designed and arranged such that the stripes of a first device are mutually offset with respect to the stripes of a second device so as to produce a continuous line in a work area, wherein the stripe of the first device alternates in each case with a respective stripe of the second device.

19. The device according to claim 2, wherein the angle is between 20° and 70°.

20. The device according to claim 2, wherein the angle is between 30° and 60°.

21. The device according to claim 2, wherein the angle is 45°.

22. The device according to claim 3, wherein the at least one deflection electrode is connected to a same voltage source as the cathode electrode.

23. The device according to claim 3, wherein the deflection surface of the at least one deflection electrode is curved.

24. The device according to claim 23, wherein the curved deflection surface has a concave curvature.

25. The device according to claim 9, wherein the deflection surface of the at least one deflection electrode is tiltable.

26. The device according to claim 12, wherein the AC voltage has a frequency between 25 kHz and 75 kHz.

27. The device according to claim 12, wherein the AC voltage has a frequency is between 40 kHz and 60 kHz.

28. The device according to claim 12, wherein the AC voltage has a frequency of 50 kHz.

* * * * *